United States Patent
Oi et al.

(10) Patent No.: US 6,897,684 B2
(45) Date of Patent: May 24, 2005

(54) INPUT BUFFER CIRCUIT AND SEMICONDUCTOR MEMORY DEVICE

(75) Inventors: Masafumi Oi, Tokyo (JP); Hiroshi Ichikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 4 days.

(21) Appl. No.: 10/379,200

(22) Filed: Mar. 4, 2003

(65) Prior Publication Data

US 2003/0169076 A1 Sep. 11, 2003

(30) Foreign Application Priority Data

Mar. 6, 2002 (JP) ........................................ 2002-060453

(51) Int. Cl.[7] ................. H03K 19/0175; H03K 19/094; H03K 3/00; G06F 1/04
(52) U.S. Cl. ........................................ 326/86; 327/297
(58) Field of Search .................... 326/86, 88, 80, 326/115, 66, 70, 71, 68; 327/108, 563, 297

(56) References Cited

U.S. PATENT DOCUMENTS

| | | | | |
|---|---|---|---|---|
| 5,225,717 A | * | 7/1993 | Shiomi et al. ................. | 326/66 |
| 5,440,248 A | * | 8/1995 | Brown et al. ................. | 326/71 |
| 5,699,010 A | * | 12/1997 | Hatanaka .................... | 327/563 |
| 5,734,617 A | * | 3/1998 | Zheng ..................... | 365/225.7 |
| 5,736,871 A | * | 4/1998 | Goto ......................... | 326/115 |
| 5,771,198 A | * | 6/1998 | Kang et al. ................. | 365/229 |
| 5,781,061 A | * | 7/1998 | Miyashita et al. ........... | 327/543 |
| 6,020,761 A | * | 2/2000 | Hwang et al. ................ | 326/80 |
| 6,172,524 B1 | * | 1/2001 | Cho ........................... | 326/70 |
| 6,184,738 B1 | * | 2/2001 | Iwamoto et al. ............. | 327/333 |
| 6,373,297 B1 | * | 4/2002 | Lee et al. .................... | 327/108 |
| 6,414,517 B1 | * | 7/2002 | Kim et al. ................... | 326/88 |
| 6,452,854 B1 | * | 9/2002 | Kato et al. .................. | 365/226 |
| 6,459,556 B1 | * | 10/2002 | Taguchi ..................... | 361/91.1 |
| 6,825,692 B1 | * | 11/2004 | Chung et al. ................ | 326/68 |

FOREIGN PATENT DOCUMENTS

| | | |
|---|---|---|
| JP | 8-306185 | 11/1996 |
| JP | 9-027192 | 1/1997 |
| JP | 9-294062 | 11/1997 |
| JP | 11-203866 | 7/1999 |
| JP | 2000-216646 | 8/2000 |

\* cited by examiner

*Primary Examiner*—Patrick Wamsley
(74) *Attorney, Agent, or Firm*—Katten Muchin Zavis Rosenman

(57) ABSTRACT

An input buffer circuit is made up from: a differential amplifier that receives an input signal from the outside and a reference voltage for determining the level of the input signal; a transistor for a first operating current path for supplying a prescribed first operating current to the differential amplifier and that, by having a prescribed fixed voltage supplied to its gate, is always ON; and at least one transistor for a second operating current path for supplying a second operating current that is greater than the first operating current to the differential amplifier when ON, the transistor for the second operating current path being ON/OFF controlled in accordance with a control signal from the outside.

8 Claims, 3 Drawing Sheets

INPUT BUFFER CIRCUIT AND SEMICONDUCTOR MEMORY DEVICE

BACKGROUND OF THE INVENTION

1. Field of the Invention

The present invention relates to an input buffer circuit for receiving data that are supplied from the outside, and more particularly to an input buffer circuit that is used at a small-amplitude interface and to a semiconductor memory device that is provided with such an input buffer circuit.

2. Description of the Related Art

The use of semiconductor memory devices such as DRAM (Dynamic Random Access Memory) in mobile terminal devices such as portable telephones and PDAS (Personal Digital Assistants) in recent years has resulted in an even greater demand for reductions in current consumption. Progress is also being made in increasing the speed of semiconductor memory devices along with the development of higher speeds in CPUs, and input buffer circuits are being used that can both transfer data at high speeds and low voltage and meet the standards of, for example, SSTL (Stub Series Terminated Logic).

A differential amplifier is typically used in the input buffer circuit of a small-amplitude interface that accords with the SSTL standard. FIG. 1 shows the construction of such an input buffer circuit of the prior art.

As shown in FIG. 1, an input buffer circuit that is constructed with a differential amplifier of the prior art is a construction that includes: first transistor Q101 and second transistor Q102 having their gates connected in common and power supply voltage VDD supplied from their sources; third transistor Q103 having its drain connected to the drain of first transistor Q101; fourth transistor Q104 having its source connected in common to the source of third transistor Q103 and its drain connected to the drain of second transistor Q102; and fifth transistor Q105 that is inserted between the sources of third transistor Q103 and fourth transistor Q104 and ground potential VSS.

Connecting the gate and drain of second transistor Q102 causes first transistor Q101 and second transistor Q102 to form a current mirror circuit. Fifth transistor Q105 has power supply voltage VDD supplied to its gate, is always set to the on state, and supplies a prescribed operating current to first transistor Q101 to fourth transistor Q104, which make up a differential amplifier.

Reference voltage VREF, which is used for determining the level of the signal that is applied as input to the gate of third transistor Q103, is supplied to the gate of fourth transistor Q104, and, for example, clock enable signal CKE for determining whether system clock CLK that is supplied to the semiconductor memory device from the outside is valid or invalid, is applied as input to the gate of third transistor Q103. Clock enable signal CKE is used for power-down control or clock-suspend control that are known in the art, or for setting to the self-refresh mode that will be explained hereinbelow.

In the construction as described above, the input buffer circuit shown in FIG. 1 compares the level of clock enable signal CKE that is supplied from the outside with the level of reference voltage VREF and supplies a high level as clock enable signal CKEB from the drain of third transistor Q103, which is the output terminal, when clock enable signal CKE is low level. On the other hand, when clock enable signal CKE that is supplied from the outside is high level, the input buffer circuit supplies a low level as clock enable signal CKEB from the drain of third transistor Q103, which is the output terminal. The "B" (bar) of clock enable signal CKEB indicates that it is an inverted signal of signal CKE.

An input buffer circuit that is made up by the differential amplifier shown in FIG. 1 suffers little fluctuation in circuit characteristics due to variations in the threshold voltage VTH of the transistors, and provides stable operation for low-amplitude signals. However, there is the problem that a fixed short-circuit current flows even in the standby/halted state in which the input signal does not change. This short-circuit current that flows during the standby/halted state must be reduced in order to meet the demand in recent years for low power consumption in semiconductor memory devices.

To meet this requirement, constructions have been proposed such as Japanese Patent Laid-Open No. 294062/1997 that cuts off the power that is supplied to the differential amplifier in the halted or standby state. FIG. 2 shows the configuration of an input buffer circuit that is disclosed in Japanese Patent Laid-Open No. 294062/1997.

As shown in FIG. 2, the input buffer circuit that is disclosed in Japanese Patent Laid-Open No. 294062/1997 is a configuration that is provided with first switch transistor Q210 between differential amplifier 201 and power supply voltage VDD. First switch transistor Q210 is turned off by enable signal EN in the standby or halted state in which the input signal (CKE in FIG. 2) does not change, whereby the supply of power to differential amplifier 201 is halted. Because the level of this output (CKEB in FIG. 2) of differential amplifier 201 is indefinite at this time, second switch transistor Q211 is provided between the output terminal and ground potential VSS, and turning on second switch transistor Q211 fixes the output voltage of differential amplifier 201 to low level.

However, a DRAM is constructed such that data are held by the storage of electric charge in capacitors that are provided in memory cells. Accordingly, a refresh operation is necessary for reading, amplifying, and rewriting data that have been written within the maximum data holding time, i.e., the time interval that data can be held. Of the various refresh operations of this type, an operation in which the semiconductor memory device itself automatically executes a refresh operation is called self-refresh.

When the circuit that is disclosed in the above-described Japanese Patent Laid-Open No. 294062/1997 is used in, for example, an input buffer circuit to which the above-described clock enable signal CKE is received as input in a semiconductor memory device that requires a refresh operation, turning off the first switch transistor in the standby or halted state, which includes the self-refresh mode, can eliminate the short-circuit current of the differential amplifier and thus can reduce current consumption.

However, some semiconductor memory devices have a construction in which a clock enable signal CKE is used for the transition to the self-refresh mode and for the recovery from the self-refresh mode as described above. Thus, using the circuit that is disclosed in Japanese Patent Laid-Open No. 294062/1997 as the input buffer circuit for the clock enable signal CKE in such a semiconductor memory device has the disadvantage that the supply of power to the differential amplifier is halted and changes in clock enable signal CKE cannot be accepted, whereby recovery from the self-refresh mode cannot be achieved.

SUMMARY OF THE INVENTION

It is an object of the present invention to provide an input buffer circuit that can both allow recovery from a refresh operation and reduce current consumption during a refresh operation, and further, to provide a semiconductor memory device that is provided with such an input buffer circuit.

To achieve the above-described objects, the input buffer circuit of the present invention includes a transistor for a first operating current path that supplies a prescribed first operating current to a differential amplifier and that is always in the on state, and a transistor for a second operating current path that is on/off-controlled in accordance with a control signal from the outside and that supplies a second operating current that is greater than the first operating current to the differential amplifier when in the on state.

In such a construction, turning on the transistor for the second operating current path by means of a control signal during normal operation enables the supply of a large operating current to the differential amplifier, and turning off the transistor for the second operating current path by means of a control signal during a refresh operation when the semiconductor memory device is in the standby or halted state enables the supply of only the first operating current to the differential amplifier. As a result, the operating current of the differential amplifier can be reduced during a refresh operation, and the current consumption of the semiconductor memory device during a refresh operation can be reduced. In addition, the semiconductor memory device can recover from a refresh operation state because a change in the clock enable signal CKE can be accepted even during a refresh operation.

The above and other objects, features, and advantages of the present invention will become apparent from the following description with reference to the accompanying drawings, which illustrate examples of the present invention.

DETAILED DESCRIPTION OF THE PREFERRED EMBODIMENTS

First Embodiment

Using DRAM as an example, we first give a brief explanation of the construction of a semiconductor memory device that is provided with the input buffer circuit of the present invention.

Figure 3:
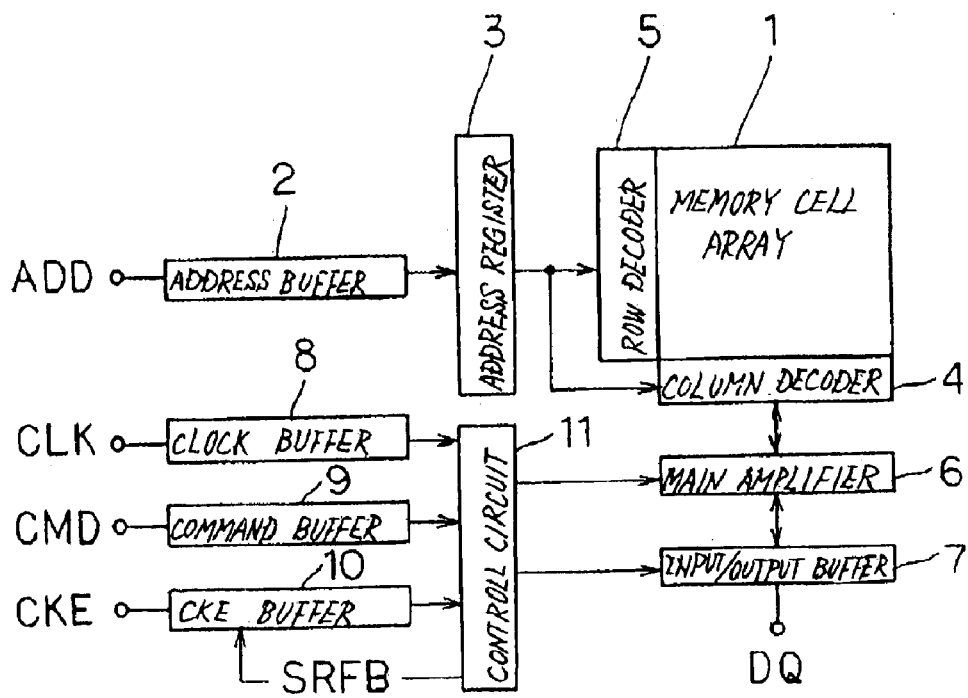
FIG. 3 is a block diagram showing an example of the configuration of a semiconductor memory device that is provided with an input buffer circuit.

We first refer to FIG. 3, which is a block diagram showing an example of the construction of a semiconductor memory device that is provided with an input buffer circuit.

As shown in FIG. 3, the semiconductor memory device is a construction that includes: memory cell array 1 that is made up from a plurality of memory cells in which data are stored; address buffer 2, which is an input buffer circuit for receiving address signals ADD for accessing memory cells in which data are written or read; address register 3 for decoding address signals ADD that are supplied from the outside and for supplying column addresses and row addresses as output; column decoder 4 for decoding the column addresses that are supplied as output from address register 3; row decoder 5 for decoding the row addresses that are supplied as output from address register 3; main amplifier 6 for amplifying data that are read from memory cell array 1 to the level of the external power supply voltage; input/output buffer 7 for both temporarily holding the write data that are received as input from the outside via data input/output terminal DQ and temporarily holding data that are read from memory cell array 1 and supplying this data as output via data input/output terminal DQ; clock buffer 8, which is an input buffer circuit for receiving system clock CLK that is supplied from the outside; command buffer 9, which is an input buffer circuit for receiving various commands CMD that are supplied from the outside; CKE buffer 10, which is an input buffer circuit for receiving clock enable signal CKE that is supplied from the outside; and control circuit 11 for receiving output signals from each of the input buffer circuits and controlling the operations of writing data to and reading data from memory cell array 1. In addition, refresh operation signal SRFB indicating whether or not the semiconductor memory device is in the refresh operation state is supplied to CKE buffer 10 from control circuit 11.

In the construction according to the foregoing description, the differential amplifier for CKE buffer 10 that receives clock enable signal CKE in the present embodiment is provided with first operating current path C1 that is always in the on state and second operating current path C2 that switches between on and off in accordance with refresh operation signal SRFB.

Figure 4:
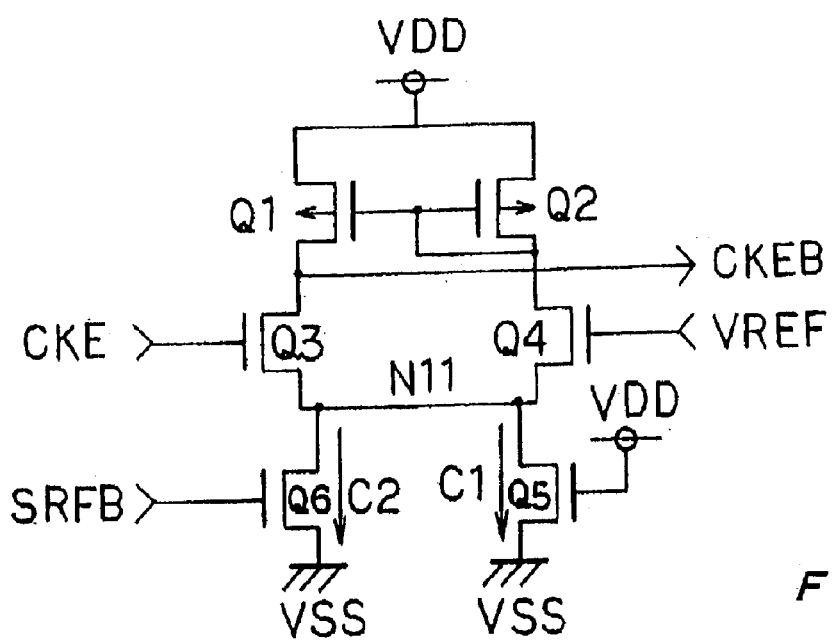
FIG. 4 is a circuit diagram showing the construction of a first embodiment of the input buffer circuit of the present invention.

We next refer to FIG. 4, which is a circuit diagram showing the construction of the first embodiment of the input buffer circuit of the present invention.

As shown in FIG. 4, the input buffer circuit of the present embodiment is a construction that includes: first transistor Q1 and second transistor Q2 having their gates connected in common and power supply voltage VDD supplied from their sources; third transistor Q3 having its drain connected to the drain of first transistor Q1; fourth transistor Q4 having its source connected in common with the source of third transistor Q3 and its drain connected to the drain of second transistor Q2; and fifth transistor Q5 and sixth transistor Q6 that are inserted between the sources of third transistor Q3 and fourth transistor Q4 and ground potential VSS. P-channel MOSFETs are used for first transistor Q1 and second transistor Q2, and n-channel MOSFETs are used for third transistor Q3 to sixth transistor Q6.

Connecting the gate and drain of second transistor Q2 causes first transistor Q1 and second transistor Q2 to form a current mirror circuit. Reference voltage VREF, which is used for determining the level of the signal that is supplied as input to the gate of third transistor Q3, is supplied to the gate of the fourth transistor Q4, and, for example, clock enable signal CKE that is supplied from the outside is applied as input to the gate of third transistor Q3.

In the input buffer circuit of the present invention, fifth transistor Q5 and sixth transistor Q6 are connected in parallel between the sources of third transistor Q3 and fourth transistor Q4 (Node N11) and ground potential VSS; first operating current path C1 is formed by fifth transistor Q5, and second operating current path C2 is formed by sixth transistor Q6.

A transistor having, for example, small transistor size (a narrow gate width) and a high channel resistance is used for fifth transistor Q5, thereby forming first operating current path C1 in which the amount of current that flows is controlled. A transistor having, for example, a large transistor size (wide gate width) and a small channel resistance is used for sixth transistor Q6, whereby second operating current path C2 is formed in which the amount of current that flows is high.

Fifth transistor Q5 has power supply voltage VDD supplied to its gate and is always set to the on state, and constantly supplies a relatively small operating current by way of first operating current path C1 to first transistor Q1 to fourth transistor Q4 that make up a differential amplifier.

Sixth transistor Q6, on the other hand, receives gate refresh operation signal SRFB as input at its gate, this refresh operation signal SRFB being supplied as output from control circuit 11; and, by turning on during normal operation, sixth transistor Q6 supplies a large operating current by way of second operating current path C2 to first transistor Q1 to fourth transistor Q4. By turning off during the self-refresh mode, sixth transistor Q6 cuts off second operating current path C2. In other words, first transistor Q1 to fourth transistor Q4 that make up the differential amplifier operate only on the operating current that is supplied from first operating current path C1 during the self-refresh mode, whereby the operating current of CKE buffer 10 can be reduced during the self-refresh mode.

Although a construction having a single sixth transistor Q6 was used to form second operating current path C2 in the differential amplifier in the input buffer circuit shown in FIG. 4, a construction may also be adopted in which a plurality of sixth transistors Q6 are provided, these sixth transistors Q6 being connected in parallel. In this case, the same transistor size may be used for fifth transistor Q5 and sixth transistors Q6.

The operation of the input buffer circuit of the present embodiment is next described with reference to the accompanying figures.

Figure 5:
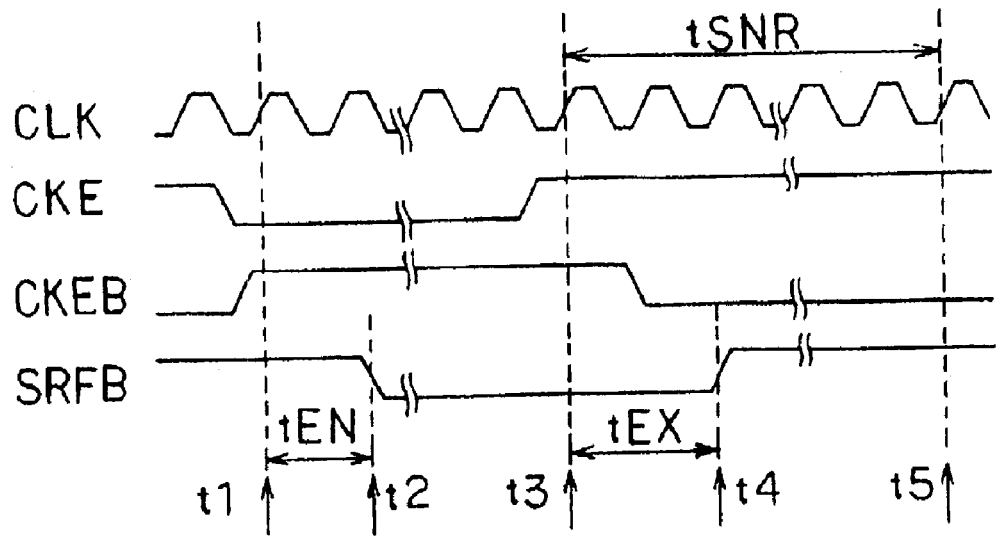
FIG. 5 is a timing chart showing the operation of the input buffer circuit of the present invention.

We first refer to FIG. 5, which is a timing chart showing the operation of input buffer circuit of the present invention.

Figure 1:
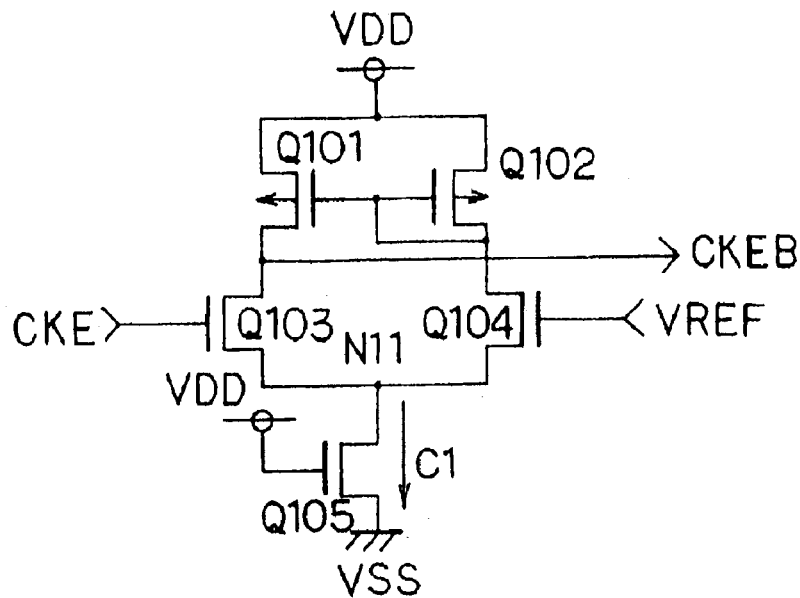
FIG. 1 is a block diagram showing the configuration of an input buffer circuit of the prior art.
Figure 2:
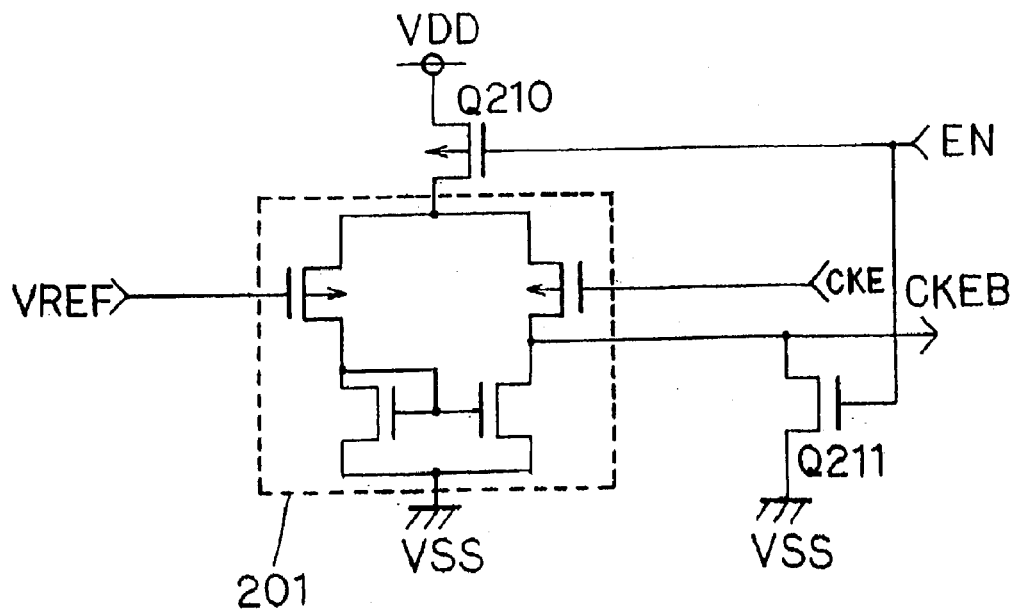
FIG. 2 is a circuit diagram showing the configuration of an input buffer circuit of the prior art for realizing lower power consumption.

As with the input buffer circuit of the prior art that is shown in FIG. 1, the input buffer circuit shown in FIG. 4 compares the level of clock enable signal CKE that is supplied from the outside with the level of reference voltage VREF, and supplies a high level as clock enable signal CKEB from the drain of third transistor Q3, which is the output terminal, when clock enable signal CKE is low level. When clock enable signal CKE that is supplied from the outside is high level, the input buffer circuit supplies a low level as clock enable signal CKEB from the drain of third transistor Q3, which is the output terminal.

The control of whether operation is in self-refresh mode or not is determined according to clock enable signal CKE. When clock enable signal CKE becomes low level at time t1 shown in FIG. 5, the semiconductor memory device is placed in the self-refresh mode. Then, when refresh operation signal SRFB becomes low level at time t2, the semiconductor memory device enters self-refresh mode and begins a prescribed refresh operation. The interval of time that elapses from times t1 to t2 is tEN.

Next, when clock enable signal CKE becomes high level at time t3, refresh operation signal SRFB switches to high level at time t4 and the semiconductor memory device recovers from the self-refresh mode. The interval of time that elapses from times t3 to t4 is tEX.

Refresh operation signal SRFB, which becomes low level during the above-described interval from t2 to t4, is supplied to the input buffer circuit, whereby sixth transistor Q6 turns off and second operating current path C2 is shut off. During the self-refresh mode, second operating current path C2 is shut off, the operating current of the input buffer circuit becomes small, and the operating speed is reduced, and as a result, the time interval tEX shown in FIG. 5 becomes longer than tEN. However, operation can proceed without problems if time interval tEX is shorter than the time interval tSNR that extends from the end of the self-refresh mode until the next command (for example, a read command for reading data) can be accepted. In other words, the amount of current that flows in first operating current path C1 is set within a range such that the operating speed of the differential amplifier satisfies the relation tEX<tSNR.

A semiconductor memory device that is provided with the input buffer circuit of the present invention can realize a reduction in current consumption during a self-refresh mode interval. In addition, because the differential amplifier is always in an operating state during the time of self-refresh mode, a change in clock enable signal CKE can be accepted and recovery can be achieved from the self-refresh mode.

Second Embodiment

Figure 6:
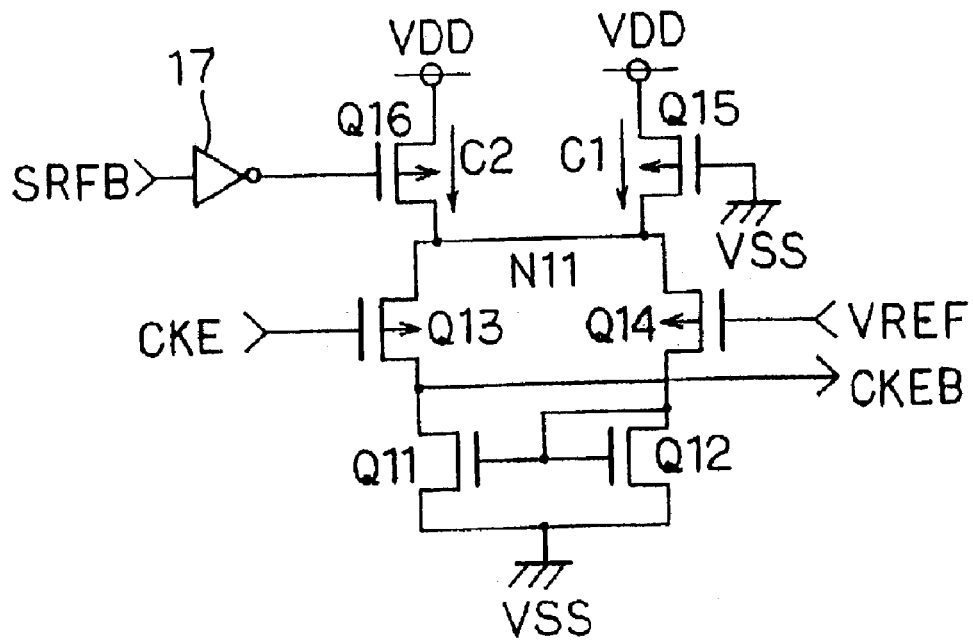
FIG. 6 is a circuit diagram showing the configuration of a second embodiment of the input buffer circuit of the present invention.

In the input buffer circuit that was shown in the first embodiment, a construction was shown in which p-channel MOSFETs were used for first transistor Q1 and second transistor Q2 and n-channel MOSFETs were used for third transistor Q3 to sixth transistor Q6 that formed the differential amplifier, but the input buffer circuit is not limited to this construction and can take on the form of the construction shown in, for example, FIG. 6.

As shown in FIG. 6, the input buffer circuit of the second embodiment is a construction that includes: first transistor Q11 and second transistor Q12 having their gates connected in common and their sources connected to ground potential VSS; third transistor Q13 having its drain connected to the drain of first transistor Q11; fourth transistor Q14 having its source connected in common with the source of third transistor Q13 and its drain connected to the drain of second transistor Q12; fifth transistor Q15 and sixth transistor Q16 that are inserted between the sources of third transistor Q13 and fourth transistor Q14 and power supply potential VDD; and inverter 17 for inverting refresh operation signal SRFB that is supplied from control circuit 11. N-channel MOSFETs are used for first transistor Q1 and second transistor Q2, and p-channel MOSFETs are used for third transistor Q3 to sixth transistor Q6.

Connecting the gate and drain of second transistor Q12 causes first transistor Q11 and second transistor Q12 to form a current mirror circuit. Reference voltage VREF that is used for determining the level of signals that are received as input at the gate of third transistor Q13 are supplied to the gate of fourth transistor Q14; and clock enable signal CKE that is supplied from the outside is applied as input to the gate of third transistor Q13.

Two transistors are provided in parallel between the sources of third transistor Q13 and fourth transistor Q14 (node N11) and power supply voltage VDD, first operating current path C1 is formed by fifth transistor Q15, and second operating current path C 2 is formed by sixth transistor Q16. A transistor having high channel resistance is used for fifth transistor Q15 to form first operating current path C1 in which the amount of current that flows is limited. In addition, a transistor having low channel resistance is used for sixth transistor Q16 to form second operating current path C2 in which the current that flows is great.

Fifth transistor Q15 has its gate connected to ground potential VSS and is always on, whereby a low operating current is always supplied by way of first operating current path C1 to first transistor Q11 to fourth transistor Q14 that make up the differential amplifier. On the other hand, sixth transistor Q16 is supplied at its gate with a signal that is obtained by using inverter 17 to invert refresh operation signal SRFB that is supplied as output from control circuit 11; whereby turning on sixth transistor Q16 during normal operation causes a large operating current to be supplied by way of second operating current path C2 to first transistor Q11 to fourth transistor Q14, and turning off sixth transistor Q16 during self-refresh mode causes second operating current path C2 to be cut off. In other words, first transistor Q11 to fourth transistor Q14 that make up the differential amplifier are operated only by the operating current that is supplied from first operating current path C1 during self-refresh mode.

In this construction, as with the input buffer circuit of the first embodiment, the level of clock enable signal CKE that is supplied from the outside is compared with the level of reference voltage VREF, and when clock enable signal CKE is low level, a high level is supplied as clock enable signal CKEB from the drain of third transistor Q3, which is the output terminal. When clock enable signal CKE that is supplied from the outside is high level, a low level is supplied as clock enable signal CKEB from the drain of third transistor Q3, which is the output terminal.

Further, as with the input buffer circuit of the first embodiment, the semiconductor memory device is placed in the self-refresh mode when clock enable signal CKE becomes low level at time t1 shown in FIG. 5. Then, when refresh operation signal SRFB becomes low level at time t2, the semiconductor memory device enters the self-refresh mode and begins a prescribed refresh operation. When clock enable signal CKE becomes high level at time t3, refresh operation signal SRFB switches to high level at time t4 and the semiconductor memory device recovers from the self-refresh mode.

In the above-described time intervals t2 to t4, refresh operation signal SRFB is low level and the output of inverter 17 is high level, and sixth transistor Q16 therefore turns off, thereby cutting off second operating current path C2.

A construction such as shown in FIG. 6 is thus also able to both reduce current consumption of a semiconductor memory device in the self-refresh mode as well as allow recovery from the self-refresh mode.

While preferred embodiments of the present invention have been described using specific terms, such description is for illustrative purposes only, and it is to be understood that changes and variations may be made without departing from the spirit or scope of the following claims.

What is claimed is:

1. An input buffer circuit comprising:
   a differential amplifier that receives an input signal and a reference voltage for determining the level of the input signal;
   a first operating current path transistor for supplying a prescribed first operating current to said differential amplifier, said first operating current path transistor, by being supplied at its gate with a prescribed fixed voltage, always being in the on state; and
   a second operating current path transistor for supplying a second operating current that is greater than said first operating current to said differential amplifier when on, said second operating current path transistor being on/off-controlled in accordance with a control signal from the outside,
   said first operating current path transistor and said second operating current path transistor being connected directly to said differential amplifier.

2. The input buffer circuit according to claim 1, wherein channel resistance of said second operating current path transistor is less than that of said first operating current path transistor.

3. A semiconductor memory device that requires a refresh operation for holding data that have been written in memory cells, said semiconductor memory device comprising:
   an input buffer circuit according to claim 2 for receiving a clock enable signal that is supplied from the outside for setting said semiconductor memory device in said refresh operation state; and
   a control circuit for generating, in accordance with an output signal of said input buffer circuit, a refresh operation signal that indicates whether or not said semiconductor memory device is in the refresh operation state, and supplying the refresh operation signal to said input buffer circuit as said control signal.

4. The input buffer circuit according to claim 1, wherein said differential amplifier comprises:
   a first transistor and a second transistor that are formed from p-channel MOSFETs and that form a current mirror circuit;
   a third transistor for receiving said input signal at its gate, said third transistor being formed from an n-channel MOSFET and being connected in a series with said first transistor; and
   a fourth transistor for receiving said reference voltage at its gate, said fourth transistor being formed from an n-channel MOSFET, having its source connected in common with the source of said third transistor, and being connected in a series with said second transistor;
   wherein said first operating current path transistor and said second operating current path transistor are each formed from n-channel MOSFETs.

5. A semiconductor memory device that requires a refresh operation for holding data that have been written in memory cells, said semiconductor memory device comprising:
   an input buffer circuit according to claim 4 for receiving a clock enable signal that is supplied from the outside for setting said semiconductor memory device in said refresh operation state; and
   a control circuit for generating, in accordance with an output signal of said input buffer circuit, a refresh operation signal that indicates whether or not said semiconductor memory device is in the refresh operation state, and supplying the refresh operation signal to said input buffer circuit as said control signal.

6. The input buffer circuit according to claim 1, wherein said differential amplifier comprises:
   a first transistor and a second transistor that are formed from n-channel MOSFETs and that form a current mirror circuit;
   a third transistor for receiving said input signal at its gate, said third transistor being formed from a p-channel MOSFET and being connected in a series with said first transistor; and
   a fourth transistor for receiving said reference voltage at its gate, said fourth transistor being formed from a p-channel MOSFET, having its source connected in common with the source of said third transistor, and being connected in a series with said second transistor;
   wherein said first operating current path transistor and said second operating current path transistor are each formed from p-channel MOSFETS.

7. A semiconductor memory device that requires a refresh operation for holding data that have been written in memory cells, said semiconductor memory device comprising:

an input buffer circuit according to claim 6 for receiving a clock enable signal that is supplied from the outside for setting said semiconductor memory device in said refresh operation state;

a control circuit for supplying as output, in accordance with an output signal of said input buffer circuit, a refresh operation signal that indicates whether or not said semiconductor memory device is in the refresh operation state; and an inverter for inverting said refresh operation signal that is supplied as output from said control circuit and supplying the inverted signal as said control signal to said input buffer circuit.

8. A semiconductor memory device that requires a refresh operation for holding data that have been written in memory cells, said semiconductor memory device comprising:

an input buffer circuit according to claim 1 for receiving a clock enable signal that is supplied from the outside for setting said semiconductor memory device in said refresh operation state; and a control circuit for generating, in accordance with an output signal of said input buffer circuit, a refresh operation signal that indicates whether or not said semiconductor memory device is in the refresh operation state, and supplying the refresh operation signal to said input buffer circuit as said control signal.

* * * * *